(12) United States Patent
Allen (10) Patent No.: US 10,553,993 B2
(45) Date of Patent: Feb. 4, 2020

(54) AVIONICS SYSTEM INTERFACE ELECTRICAL CONNECTOR

(71) Applicant: THE BOEING COMPANY, Chicago, IL (US)

(72) Inventor: Michael James Allen, Edmond, OK (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/950,594

(22) Filed: Apr. 11, 2018

(65) Prior Publication Data
US 2019/0319408 A1    Oct. 17, 2019

(51) Int. Cl.
| | | |
|---|---|---|
| *H01R 13/6585* | (2011.01) | |
| *H01R 31/06* | (2006.01) | |
| *H02G 3/04* | (2006.01) | |
| *B64D 47/00* | (2006.01) | |
| *H02G 3/22* | (2006.01) | |
| *H01B 7/00* | (2006.01) | |

(52) U.S. Cl.
CPC ......... *H01R 13/6585* (2013.01); *B64D 47/00* (2013.01); *H01R 31/06* (2013.01); *H02G 3/045* (2013.01); *H01B 7/0045* (2013.01); *H01R 2201/26* (2013.01); *H02G 3/22* (2013.01)

(58) Field of Classification Search
CPC ........................... H01R 13/6585; H01R 31/06; H01R 2201/26; B64D 47/00; H02G 3/045; H02G 3/22; H01B 7/0045
USPC ........... 439/607.05, 67, 225, 650, 651, 912; 324/542, 556; 340/340, 653
See application file for complete search history.

(56) References Cited

U.S. PATENT DOCUMENTS

| | | | | |
|---|---|---|---|---|
| 1,697,237 A * | 1/1929 | Greene | .................. | H01R 24/58 |
| | | | | 361/301.1 |
| 2,795,664 A * | 6/1957 | Conrad | ................ | G01R 19/155 |
| | | | | 200/51.1 |
| 3,234,433 A * | 2/1966 | Braunagel | .............. | H05K 7/023 |
| | | | | 174/255 |
| 3,510,825 A * | 5/1970 | Quackenbush | ........ | H01R 31/02 |
| | | | | 174/34 |
| 4,342,497 A * | 8/1982 | Morrison | ............. | H01R 11/282 |
| | | | | 439/522 |
| 4,620,765 A * | 11/1986 | Knickerbocker | .... | G01R 1/0408 |
| | | | | 439/344 |
| 4,945,188 A * | 7/1990 | Jackson | ................. | H02G 5/002 |
| | | | | 174/16.2 |
| 5,281,147 A | 1/1994 | Hughes | | |
| 5,605,468 A * | 2/1997 | Wood | ..................... | G01V 1/201 |
| | | | | 439/281 |
| 5,655,933 A * | 8/1997 | Skowronski | .......... | H01R 31/02 |
| | | | | 29/844 |

(Continued)

*Primary Examiner* — Travis S Chambers
(74) *Attorney, Agent, or Firm* — Armstrong Teasdale LLP (57) ABSTRACT

An electrical connector includes a first pass-through connector, a second pass-through connector, and a center portion coupled between the first pass-through connector and the second pass-through connector. The center portion includes a plurality of electrical connection points on an exterior surface of the center portion. The electrical connector also includes a plurality of pass-through wires extending from the first pass-through connector to the second pass-through connector through the center portion, wherein the plurality of electrical connection points are electronically coupled to the plurality of pass-through wires.

40 Claims, 7 Drawing Sheets

(56) References Cited

U.S. PATENT DOCUMENTS

| | | | | |
|---|---|---|---|---|
| 5,683,261 | A * | 11/1997 | Ahles | H01R 29/00 439/189 |
| 5,686,840 | A * | 11/1997 | Johnson | G01D 18/00 324/542 |
| 5,723,820 | A * | 3/1998 | Whitney | H02G 5/06 174/71 R |
| 6,044,164 | A * | 3/2000 | Ach-Kowalewski | H04R 25/505 381/312 |
| 6,394,849 | B2 * | 5/2002 | Kasai | H01R 9/2458 439/655 |
| 6,540,527 | B1 * | 4/2003 | Tamarkin | H01R 12/62 439/67 |
| 6,793,401 | B2 | 9/2004 | Daniel | |
| 7,225,065 | B1 | 5/2007 | Hunt et al. | |
| 7,322,857 | B2 * | 1/2008 | Chen | H01R 12/7041 439/623 |
| 7,596,437 | B1 | 9/2009 | Hunt et al. | |
| 7,690,950 | B2 * | 4/2010 | Owen, Sr. | B60R 16/0207 439/336 |
| 7,946,890 | B1 * | 5/2011 | Bondo | H04R 25/556 439/638 |
| 8,003,888 | B2 * | 8/2011 | Owen, Sr. | H02G 15/08 174/135 |
| 8,403,702 | B2 | 3/2013 | Lopes et al. | |
| 9,039,441 | B2 * | 5/2015 | Takamori | H01R 12/62 439/495 |
| 10,017,135 | B2 * | 7/2018 | Tsukamoto | H01R 4/34 |

\* cited by examiner

AVIONICS SYSTEM INTERFACE ELECTRICAL CONNECTOR

BACKGROUND

The field of the disclosure relates to an avionics system interface, and in particular, to an avionics system interface that includes a cable harness quick-connect adapter that enables testing of signals being communicated therethrough.

At least some known aircraft transmit signals through a breakout box for testing. A breakout box serves as a troubleshooting tool to determine the characteristics of the electrical signals passing through the wiring of an electrical connector interface on a networking device or computer. Typically, a breakout box is connected between two electrical devices to determine which signal or power interconnects are active or to electrically test signals, voltage levels, data bus, lines, digital and analog and discretes. In at least some known embodiments, the breakout box is connected on one side to an aircraft wire harness that holds wires that communicate signals and data representative of the aircraft status and on the opposite side to a bulkhead connector. Typically, the breakout box is connected to the wire harness and bulkhead connector via additional wire harnesses, also known as jumpers, that may be 10 feet or more in length.

In at least some known embodiments, the breakout box is made of metallic materials and individual signal shielding is typically not provided to the wires inside the box; where the multiple types of signals, including power, databus, and analog and digital discretes, are spliced into open banana-jack-type quick-access signal points. As such, at least some known breakout boxes represent compounded opportunity for degradation of signal quality, including the mixing of incompatible signal types, whether by physical contact or electromagnetic interaction, and/or unintentional input of spurious, alternative signal types and inadvertent grounding. Additionally, the use of jumpers to connect the breakout box may further impact the electromagnetic characteristics of the wiring installation as well as adding multiple additional disconnect points where signal integrity can be degraded.

BRIEF DESCRIPTION

In one aspect, an electrical connector is provided. The electrical connector includes a first pass-through connector, a second pass-through connector, and a center portion coupled between the first pass-through connector and the second pass-through connector. The center portion includes a plurality of electrical connection points on an exterior surface of the center portion. The electrical connector also includes a plurality of pass-through wires extending from the first pass-through connector to the second pass-through connector through the center portion, wherein the plurality of electrical connection points are electronically coupled to the plurality of pass-through wires.

In another aspect, an avionics system interface is provided. The avionics system interface includes a wire harness including a plurality of wires, a wire harness connector coupled to the wire harness and the plurality of wires, and a disconnect connector. The avionics system interface also includes an electrical connector coupled between the wire harness connector and the disconnect connector. The electrical connector includes a first pass-through connector coupled to the wire harness connector and a second pass-through connector coupled to the disconnect connector. A center portion of the electrical connector is coupled between the first pass-through connector and the second pass-through connector and includes a plurality of electrical connection points on an exterior surface of the center portion. The electrical connector also includes a plurality of pass-through wires extending from the first pass-through connector to the second pass-through connector through the center portion, wherein the plurality of electrical connection points are electronically coupled to the plurality of pass-through wires.

The features, functions, and advantages that have been discussed can be achieved independently in various embodiments or may be combined in yet other embodiments further details of which can be seen with reference to the following description and drawings.

DETAILED DESCRIPTION

The implementations described herein include an avionics system interface that includes an electrical connector coupled in-line with a wire harness and configured to transmit signals therethrough while also providing testing equipment access to the signals. The electrical connector includes a first pass-through connector connected to the connector of the wire harness, a second pass-through connector connected to a disconnect of the avionics system interface, and a center portion coupled between the first pass-through connector and the second pass-through connector. The center portion includes a plurality of electrical connection points on an exterior surface of the center portion. The electrical connector also includes a plurality of pass-through wires extending from the first pass-through connector to the second pass-through connector through the center portion, wherein the plurality of electrical connection points are electronically coupled to the plurality of pass-through wires. In one embodiment, the center portion is provisioned with pin-insert and/or pin-out connectors arranged around the circumference of the center section, where the pin-insert and/or pin-out connectors are connected to the pass-through connectors, thereby providing access to the individual signals passing through the electrical connector. In another embodiment, the center portion is provisioned with contacts corresponding to respective contacts on a removable clasp-type adapter ring that is coupled about the center portion. The adapter ring includes adapter connectors that provide access to the individual signals passing through the electrical connector.

The electrical connector described herein is a quick-disconnect cable harness signal break-out adapter for aircraft connectors that provides easy access to all aircraft signals passing through the electrical connector with minimum signal line interruption and minimum electromagnetic interference for the purpose of providing clean signal outputs to data analysis computer programs and/or aircraft test set interfaces. More specifically, the electrical connector maintains the integrity of the originating signal by minimizing the length of extension wire the signal travels through, thereby reducing distortion, minimizing the exposure of signal wires to the electromagnetic influence of other sources, both inside and outside the adapter, and providing an unaltered signal for output to signal and data analysis tools.

Figure 1:
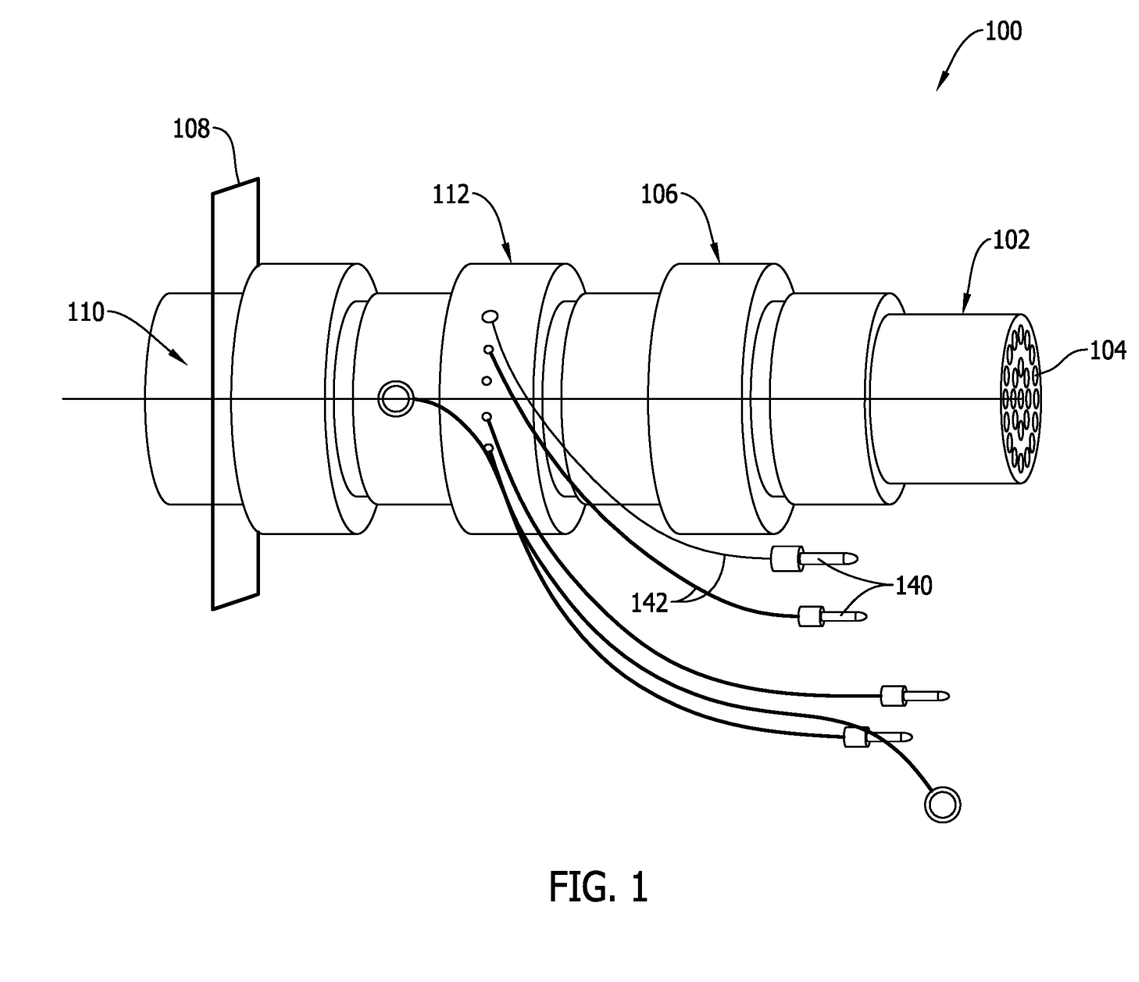
FIG. 1 is a schematic view of an exemplary modular avionics system interface.

FIG. 1 is a schematic view of an exemplary modular avionics system interface 100 including a wire harness 102 having a plurality of wires 104 and a wire harness connector 106 coupled to wire harness 102 and wires 104. In one embodiment plurality of wires 104 transmit electrical signals that represent data indicative of the status in which wire harness 102 is installed, for example, in an aircraft. Avionics system interface 100 also includes a structural panel 108 and a disconnect connector 110 coupled to structural panel 108. For example, in the exemplary embodiment, structural panel 108 is a bulkhead or tray of an aircraft and disconnect connector 110 is a bulkhead connector.

In one embodiment, avionics system interface 100 further includes an electrical connector 112 coupled between wire harness connector 106 and disconnect connector 110. As described in more detail herein, electrical connector 112 is a quick-disconnect cable harness signal break-out adapter for aircraft connectors that provides easy access to all aircraft signals passing through electrical connector 112 with minimum signal line interruption and minimum electromagnetic interference for the purpose of providing clean signal outputs to data analysis computer programs and/or aircraft test set interfaces. Although shown as being connected to disconnect connector 110, in some embodiments, for example in newly manufactured aircraft, electrical connector 112 is coupled directly to structural panel 108 and avionics system interface 100 does not include disconnect connector 110.

Figure 2:
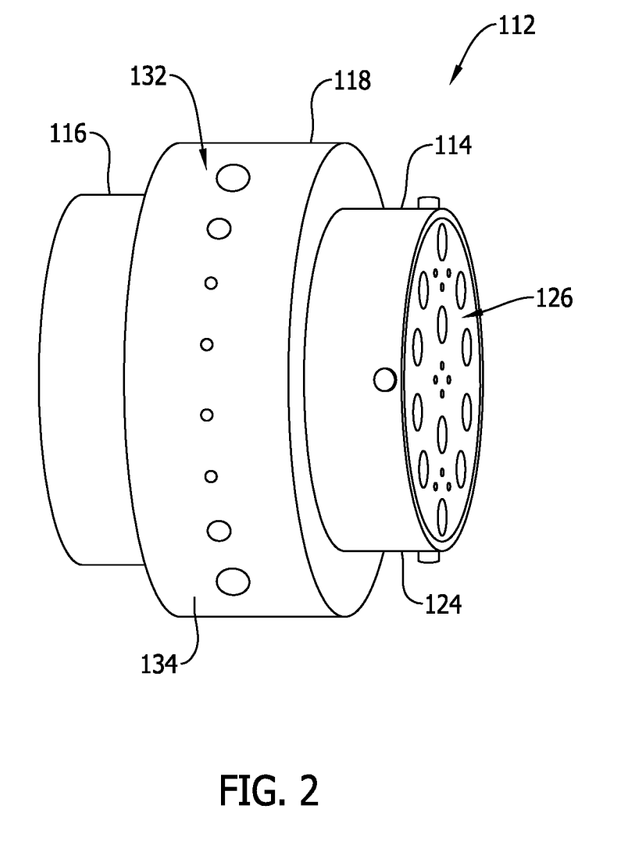
FIG. 2 is a perspective view of an exemplary electrical connector that may be used with the modular avionics system interface shown in FIG. 1.
Figure 3:
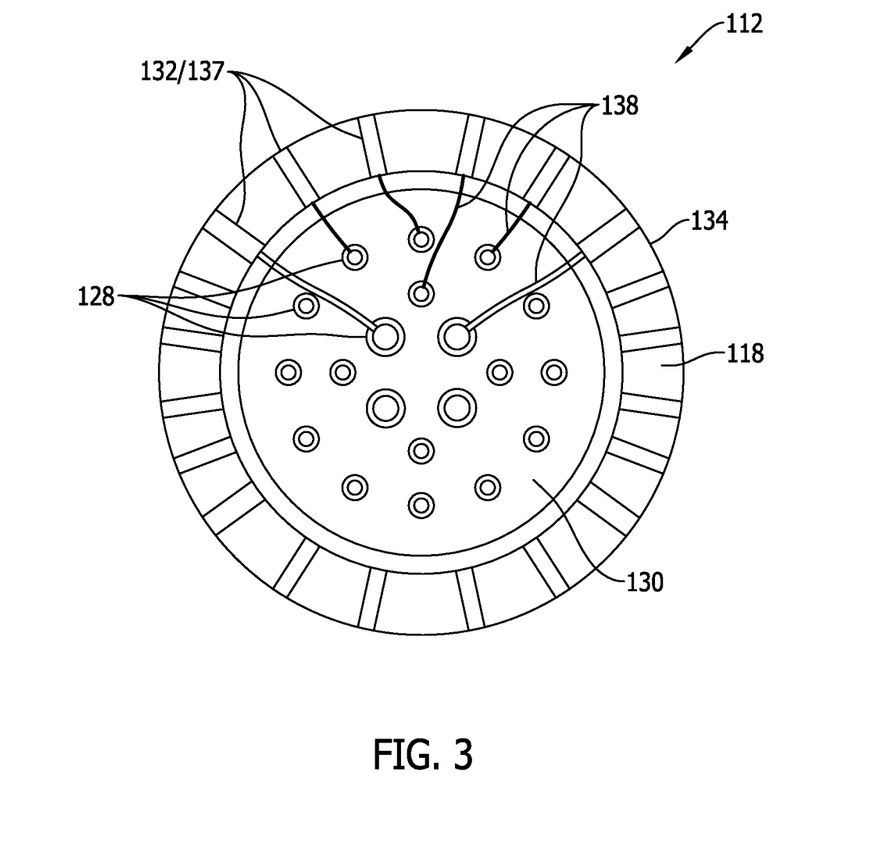
FIG. 3 is a cross-sectional view of the electrical connector shown in FIG. 2.
Figure 4:
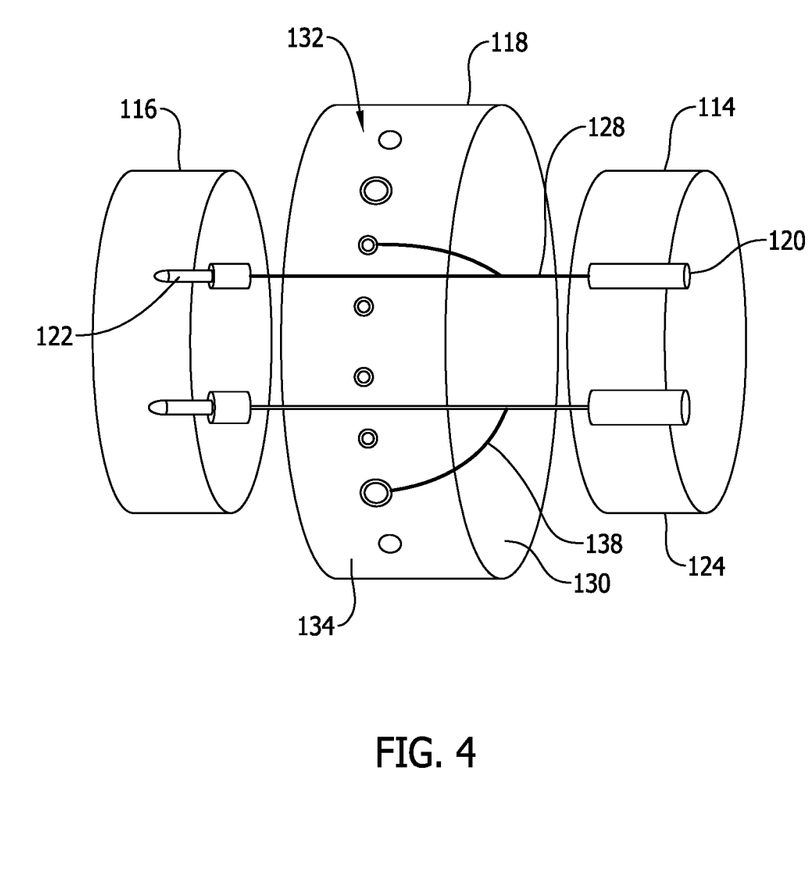
FIG. 4 is a schematic view of the electrical connector shown in FIG. 2.

FIG. 2 is a perspective view of an exemplary electrical connector 112, FIG. 3 is a cross-sectional view of electrical connector 112, and FIG. 4 is a schematic view of electrical connector 112. In one embodiment, electrical connector 112 includes a first pass-through connector 114 coupled to wire harness connector 106 and a second pass-through connector 116 coupled to disconnect connector 110. A center portion 118 of electrical connector 112 is coupled between first pass-through connector 114 and second pass-through connector 116. As best shown in FIG. 4, first pass-through connector 114 includes a plurality of sockets 120 for coupling with wire harness connector 106 (shown in FIG. 1) and second pass-through connector 116 includes a plurality of pins 122 for coupling with disconnect connector 110. Alternatively, first pass-through connector 114 includes plurality of pins 122 and second pass-through connector 116 includes plurality of sockets 120.

As best shown in FIG. 2, in one embodiment, each of first pass-through connector 114 and second pass-through connector 116 include a sleeve 124 and a removable insert 126 positioned within sleeve 124. Removable insert 126 is a first removable insert 126 of a plurality of removable inserts 126 that are interchangeable based on a configuration of wire harness connector 106 and disconnect connector 110. As such, the same single electrical connector 112 may be used with different configurations of wire harness connector 106 and disconnect connector 110 by inserting the removable insert 126 that corresponds to the particular wire harness connector 106 or disconnect connector 110 in use. More specifically, each removable insert 126 includes a configuration of a plurality of sockets 120 or pins 122 that correspond to a plurality of sockets or pins on wire harness connector 106 or disconnect connector 110.

As shown in FIG. 4, electrical connector 112 also includes a plurality of pass-through wires 128 extending from first pass-through connector 114 to second pass-through connector 116 between through center portion 118. More specifically, each pass-through wire 128 extends through center portion 118 between a corresponding socket 120 and pin 122. In one embodiment, electrical connector 112 includes a shielding material 130 coupled within at least one of first pass-through connector 114, second pass-through connector 116, and center portion 118. Shielding material 130 is an electromagnetically inert material, such as, but not limited to foam, that reduces electromagnetic interference between the plurality of pass-through wires 128.

In the illustrated embodiment, electrical connector 112 further includes a plurality of electrical connection points 132 on an exterior surface 134 of center portion 118. Each electrical connection point 132 is electrically coupled to a corresponding pass-through wire 128 that extends through center portion 118. More specifically, electrical connector 112 includes a plurality of signal connectors 138 coupled between electrical connection points 132 and pass-through wires 128. As such, each signal connector 138 of the plurality of signal connectors 138 is configured to electrically couple an electrical connection point 132 of the plurality of electrical connection points 132 to a pass-through wire 128 of the plurality of pass-through wires 128 to carry a signal between the pass-through wire 128 and the electrical connection point 132. In one embodiment, as shown in FIGS. 2-4, electrical connection points 132 are in the form of a socket 137 extending into center portion 118 and are configured to receive a pin of a testing device (not shown). In other embodiments, as shown in FIG. 1, electrical connection points 132 are in the form of a pin 140 and a wire 142 extending from center portion 118 and are configured to be inserted into a socket of a testing device (not shown).

In operation, electrical connector 112 is inserted into avionics system interface 100 by coupling wire harness connector 106 to first pass-through connector 114 of electrical connector 112. In one embodiment, removable insert 126 having a plurality of sockets 120 that matches the pins of wire harness connector 106 is selected and inserted into sleeve 124 of first pass-through connector 114. A similar operation is performed for second pass-through connector 116 to match disconnect connector 110. In another embodiment, first pass-through connector 114 and second pass-through connector 116 do not include removable inserts 126 and a user chooses a specific electrical connector 112 whose first pass-through connector 114 and second pass-through connector 116 includes connections that match wire harness connector 106 and disconnect connector 110, respectively.

When electrical connector 112 is connected between wire harness connector 106 and disconnect connector 110, the plurality of pass-through wires 128 transmit signals representative of aircraft data therebetween. As described herein, electrical connection points 132 are coupled in electrical communication with pass-through wires 128 via a plurality of signal connectors 138 such that each signal connector 138 electrically couples a pass-through wire 128 to a corresponding electrical connection point 132. As such, when a user connects testing equipment to electrical connector 112 via electrical connection points 132, the testing equipment is provided with access to the individual signals passing through electrical connector 112 with minimum signal line interruption and minimum electromagnetic interference for the purpose of providing clean signal outputs to data analysis computer programs and/or aircraft test set interfaces.

Figure 5:
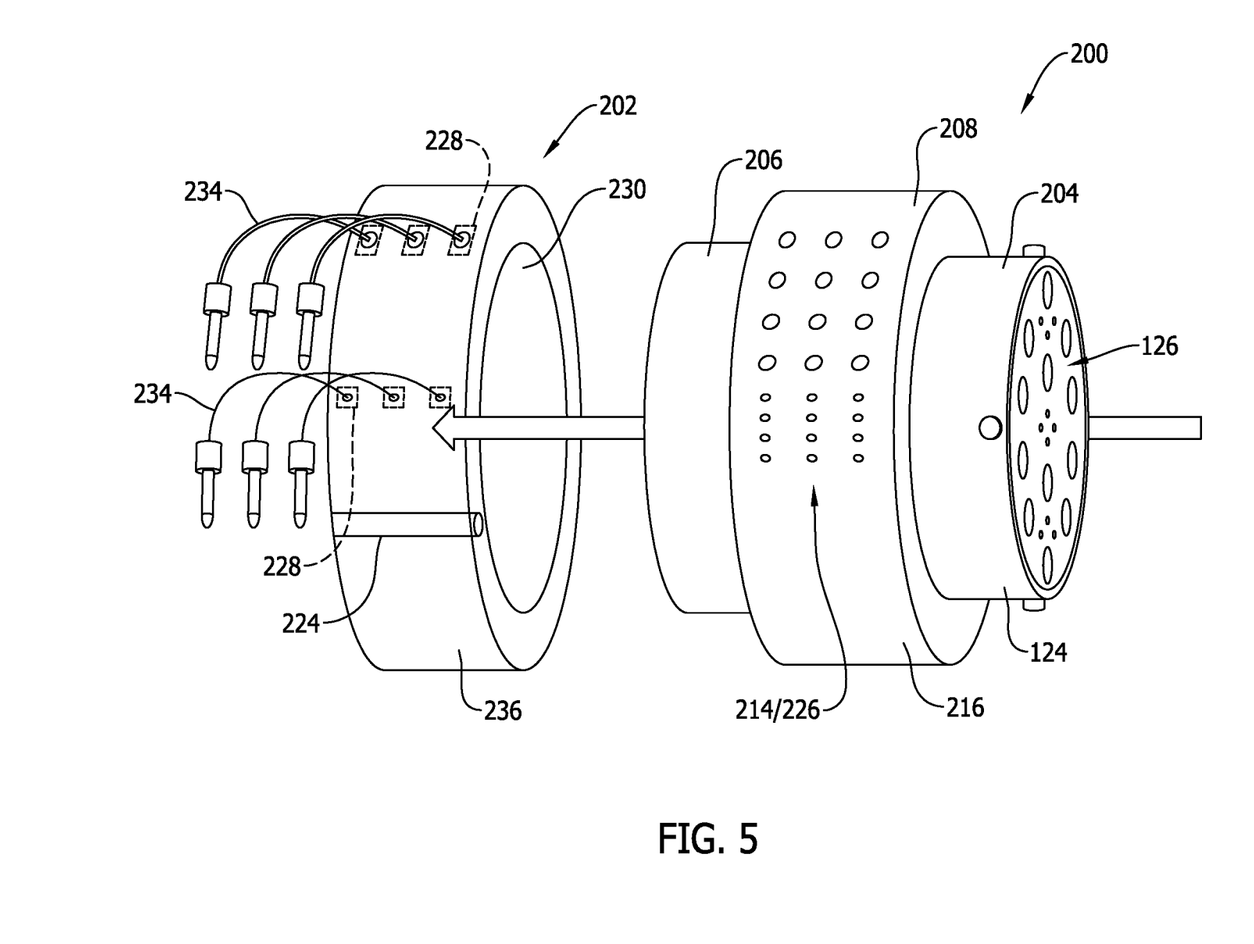
FIG. 5 is a perspective view of an alternative electrical connector and adapter ring that may be used with the modular avionics system interface shown in FIG. 1.
Figure 6:
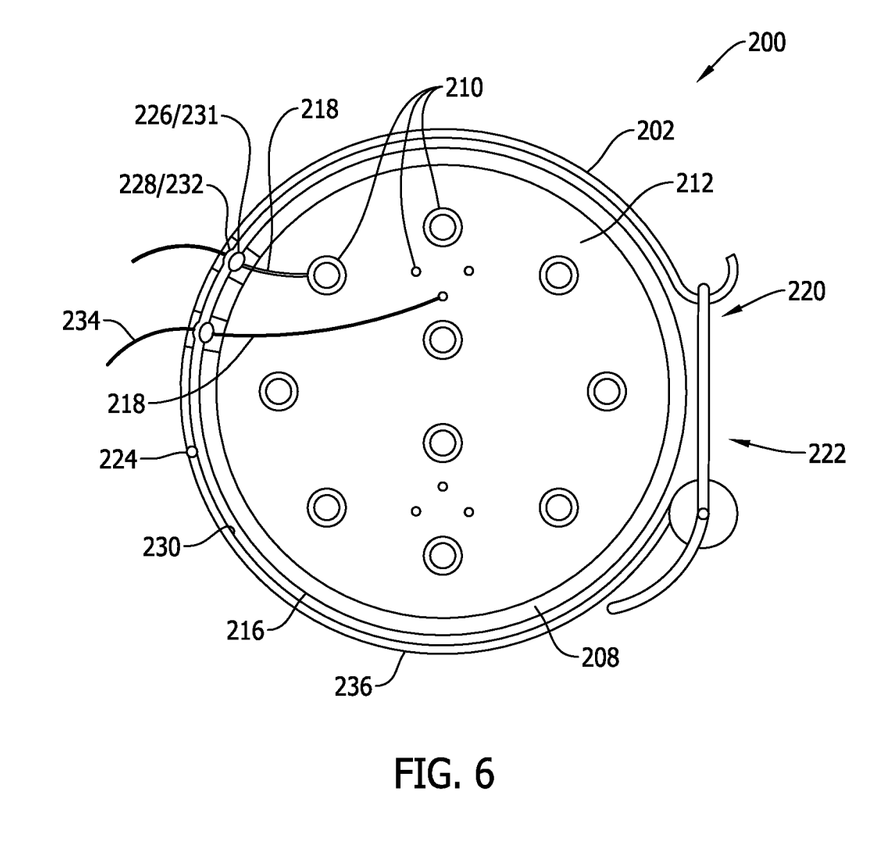
FIG. 6 is a cross-sectional view of the electrical connector and adapter ring shown in FIG. 5.

FIG. 5 is a perspective view of an alternative electrical connector 200 with an adapter ring 202 that may be used with the modular avionics system interface 100 shown in FIG. 1. Specifically, alternative electrical connector 200 and adapter ring 202 may be used instead of electrical connector 112. FIG. 6 is a cross-sectional view of electrical connector 200 and adapter ring 202, and FIG. 7 is a schematic view of electrical connector 200.

In one embodiment, electrical connector 200 includes a first pass-through connector 204, which is substantially similar to first pass-through connector 114, configured to couple to wire harness connector 106 and a second pass-through connector 206, which is substantially similar to second pass-through connector 116, configured to couple to disconnect connector 110. A center portion 208 of electrical connector 200 is coupled between first pass-through connector 204 and second pass-through connector 206. Because pass-through connectors 204 and 206 are substantially similar to pass-through pass-through connectors 114 and 116, like reference numbers will be used in FIGS. 5-7 to indicate like components as in FIGS. 2-4 and a detailed description of pass-through connectors 204 and 206 is omitted.

Figure 7:
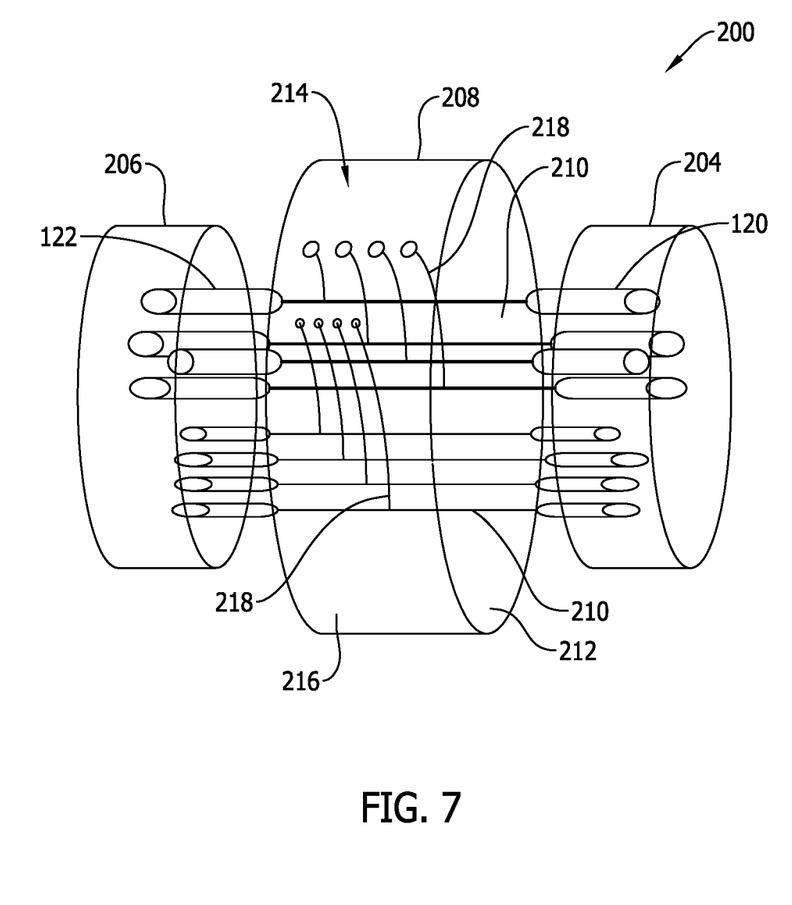
FIG. 7 is a schematic view of the electrical connector shown in FIG. 5.

As shown in FIG. 7, electrical connector 200 includes a plurality of pass-through wires 210 extending from first pass-through connector 204 to second pass-through connector 206 between through center portion 208. More specifically, each pass-through wire 210 extends through center portion 208 between a corresponding socket 120 and pin 122. In one embodiment, electrical connector 200 includes a shielding material 212 coupled within at least one of first pass-through connector 204, second pass-through connector 206, and center portion 208. Shielding material 212 is an electromagnetically inert material, such as, but not limited to foam, that reduces electromagnetic interference between the plurality of pass-through wires 210.

In the illustrated embodiment, electrical connector 200 further includes a plurality of electrical connection points 214 on an exterior surface 216 of center portion 208. Each electrical connection point 214 is electrically coupled to a corresponding pass-through wire 210 that extends through center portion 208. More specifically, electrical connector 200 includes a plurality of signal connectors 218 coupled between electrical connection points 214 and pass-through wires 210. As such, each signal connector 218 of the plurality of signal connectors 218 is configured to electrically couple an electrical connection point 214 of the plurality of electrical connection points 214 to a pass-through wire 210 of the plurality of pass-through wires 210 to carry a signal between the pass-through wire 210 and the electrical connection point 214.

As shown in FIGS. 5 and 6, electrical connector 200 includes adapter ring 202 removably coupled about center portion 208 of electrical connector 200. Adapter ring 202 includes a fastening mechanism 220 that forms a break 222 in adapter ring 202 to facilitate coupling adapter ring 202 about center portion 208. In operation, fastening mechanism 220 is unsecured to enable electrical connector 200 to be inserted into adapter ring 202 through break 222. Once adapter ring 202 is positioned around electrical connector 200, fastening mechanism 220 is secured to close break 222 and to secure adapter ring 202 to electrical connector 200. In the illustrated embodiment, fastening mechanism 220 includes a hook on one side of break 222 and a releasable clasp on the opposing side of break 222 that fits over the hook and is then latched to secure adaptor ring 202 around center portion 208. Fastening mechanism 220 may be any type of mechanism that makes adapter ring 202 separable in at least one location to secure adapter ring 202 to electrical connector 200, such as, but not limited to, a clamp, a clasp, and a clip. Additionally, in one embodiment, adapter ring 202 includes a hinge 224 to facilitate opening break 222 sufficiently wide to receive electrical connector 200 therein. Alternatively, or in combination, adapter ring 202 is formed from a flexible material that enables adapter ring 202 to flex sufficiently wide to receive electrical connector 200 therein.

In one embodiment, electrical connection points 214 include a first set of electrical contacts 226, and adapter ring 202 includes a second set of electrical contacts 228 on an inner surface 230 of adapter ring 202. In operation, first set of electrical contacts 226 is configured to mate with second set of electrical contacts 228 when adapter ring 202 is coupled about center portion 208. More specifically, first set of electrical contacts 226 includes a plurality of protrusions 231 and second set of electrical contacts 228 includes a plurality of recesses 232 that mate with plurality of protrusions 231. For example, plurality of protrusions 231 and plurality of recesses 232 may be in a ball grid array that mechanically and electrically couple electrical connector 200 to adapter ring 202. Alternatively, first set of electrical contacts 226 may be a plurality of sockets and second set of electrical contacts 228 may be a plurality of pins that are inserted into the sockets of first set of electrical contacts 226. In operation, adapter ring 202 is positioned about electrical connector 200 such that first set of electrical contacts 226 seat with second set of electrical contacts 228 and fastening mechanism 220 is activated to apply pressure to corresponding electrical contacts 226 and 228 such that to electrical integrity is maintained and such that adapter ring 202 is resistant to movement with respect to electrical connector 200.

Although FIG. 6 illustrates a gap between inner surface 230 of adaptor ring 202 and exterior surface 216 of center portion 208 such that first set of electrical contacts 226 are not touching second set of electrical contacts 228 when fastening mechanism 220 is secured, this is for illustration purposes only. In operation, when fastening mechanism 220 is secured to close break 222, first set of electrical contacts 226 make contact with second set of electrical contacts 228 and inner surface 230 is substantially in contact with exterior surface 216. Furthermore, although center portion 218 and adaptor ring 202 are illustrated as oval in shape, center portion 218 and adaptor ring 202 may be circular. Generally, as long as inner surface 230 and exterior surface 216 are substantially similar in shape, center portion 218 and adaptor ring 202 are any shape that facilitates operation of avionics system interface 100 as described herein.

As shown in FIG. 5, adapter ring 202 includes a plurality of adapter electrical connectors 234 on an outer surface 236 of adapter ring 202. In one embodiment, adapter electrical connectors 234 are wire and pin connectors that are configured for insertion into a corresponding socket of a testing mechanism. Each adapter electrical connector 234 is electrically coupled to a corresponding pass-through wire 210 via said first set of electrical contacts 226 and second set of electrical contacts 228. More specifically, adapter electrical connectors 234 are able to tap into the signal being transmitted through pass-through wires 210 because adapter electrical connectors 234 are electrically coupled to second set of electrical contacts 228 through adapter ring 202, and second set of electrical contacts 228 are electrically coupled to first set of electrical contacts 226, and first set of electrical contacts 226 are electrically coupled to pass-through wires 210 via signal connectors 218.

In operation, electrical connector 200 is inserted into avionics system interface 100 by coupling wire harness connector 106 to first pass-through connector 204 of electrical connector 200. In one embodiment, removable insert 126 having a plurality of sockets 120 that matches the pins of wire harness connector 106 is selected and inserted into sleeve 124 of first pass-through connector 114. A similar operation is performed for second pass-through connector 206 to match disconnect connector 110. In another embodiment, first pass-through connector 204 and second pass-through connector 206 do not include removable inserts 126 and a user chooses a specific electrical connector 200 whose first pass-through connector 204 and second pass-through connector 206 includes connections that match wire harness connector 106 and disconnect connector 110, respectively.

When electrical connector 200 is connected between wire harness connector 106 and disconnect connector 110, the plurality of pass-through wires 210 transmit signals representative of aircraft data therebetween. As described herein, electrical connection points 214, in the form of first set of electrical contacts 226, are coupled in electrical communication with pass-through wires 210 via a plurality of signal connectors 218 such that each signal connector 218 electrically couples a pass-through wire 210 to a corresponding electrical connection point 214.

Adapter ring 202 is then coupled about the outer circumference of center portion 208 of electrical connector 200 such that second set of electrical contacts 228 in inner surface 230 of adapter ring 202 mate with first set of electrical contacts 226 on exterior surface 216 of center portion 208. As such, adapter ring 202, and its adapter electrical connectors 234, are in electrical communication with the pass-through wires 210 via electrical contact sets 226 and 228 and signal connectors 218.

In one embodiment, a user may choose an adapter ring 202 that includes a configuration of adapter electrical connectors 234 that match the desired testing equipment to be used. Accordingly, when a user connects the testing equipment to adapter ring 202 via adaptor electrical connectors 234, the testing equipment is provided with access to the individual signals passing through electrical connector 200 with minimum signal line interruption and minimum electromagnetic interference for the purpose of providing clean signal outputs to data analysis computer programs and/or aircraft test set interfaces.

The electrical connector described herein is a quick-disconnect cable harness signal break-out adapter for aircraft connectors that provides easy access to all aircraft signals passing through the electrical connector with minimum signal line interruption and minimum electromagnetic interference for the purpose of providing clean signal outputs to data analysis computer programs and/or aircraft test set interfaces. More specifically, the electrical connector maintains the integrity of the originating signal by minimizing the length of extension wire the signal travels through, thereby reducing distortion, minimizing the exposure of signal wires to the electromagnetic influence of other sources, both inside and outside the adapter, and providing an unaltered signal for output to signal and data analysis tools.

Accordingly the electrical connector described herein facilitates reduced costs in test and evaluation installations, installation man-hours, and test and evaluation man-hours across all aerospace-type wire harness installations (all classes of fixed-wing, rotary, maritime) and whether containing power, discrete and/or databus electrical/electronic systems. Further, the electrical connector is also customizable to any wiring interface architecture which is not represented by aerospace-type wiring such as automobile or rail systems. Additionally, the electrical connector increases the amount and quality of data which is readily and immediately available to the systems or test engineer in the performance of checkout or troubleshooting activities.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electrical connector comprising:
   a first pass-through connector;
   a second pass-through connector;
   a center portion coupled between said first pass-through connector and said second pass-through connector and comprising a plurality of electrical connection points on an exterior surface of said center portion;
   an adapter ring configured to couple about said center portion; and
   a plurality of pass-through wires extending from first pass-through connector to said second pass-through connector through said center portion, wherein said plurality of electrical connection points are electronically coupled to said plurality of pass-through wires.

2. The electrical connector of claim 1, further comprising a plurality of signal connectors coupled between said plurality of electrical connection points and said plurality of pass-through wires, wherein each signal connector of said plurality of signal connectors is configured to electrically couple an electrical connection point of said plurality of electrical connection points to a pass-through wire of said plurality of pass-through wires to carry a signal therebetween.

3. The electrical connector of claim 1, wherein each electrical connection point of said plurality of electrical connection points is electrically coupled to a corresponding pass-through wire of said plurality of pass-through wires.

4. The electrical connector of claim 1, wherein said plurality of electrical connection points comprise a socket extending into said center portion and configured to receive a pin therein.

5. The electrical connector of claim 1, wherein said plurality of electrical connection points comprise a pin configured to be inserted into a socket.

6. The electrical connector of claim 1, further comprising a shielding material coupled within at least one of said first pass-through connector, said second pass-through connector, and said center portion, wherein said shielding material is configured to reduce electromagnetic interference around said plurality of pass-through wires.

7. The electrical connector of claim 1, wherein said first pass-through connector comprises one of a plurality of sockets or a plurality of pins, and wherein said second pass-through connector comprises the remaining one of said plurality of sockets or said plurality of pins.

8. The electrical connector of claim 1, wherein said plurality of electrical connection points comprise a first set of electrical contacts, and wherein said adapter ring comprises a second set of electrical contacts on an inner surface of said adapter ring, and wherein said first set of electrical contacts is configured to mate with said second set of electrical contacts when said adapter ring is coupled about said center portion.

9. The electrical connector of claim 8, wherein said first set of electrical contacts comprises one of a plurality of protrusions or a plurality of recesses, and wherein said second set of electrical contacts comprises the remaining one of said plurality of protrusions or said plurality of recesses.

10. The electrical connector of claim 8, wherein said adapter ring comprises a plurality of adapter electrical connectors on an outer surface of said adapter ring, wherein said plurality of adapter electrical connectors are electrically coupled to said plurality of pass-through wires via said first set of electrical contacts and said second set of electrical contacts.

11. The electrical connector of claim 8, wherein said adapter ring comprises a fastening mechanism configured to form a break in said adapter ring to facilitate coupling said adapter ring about said center portion.

12. An avionics system interface comprising:
a wire harness comprising a plurality of wires;
a wire harness connector coupled to said wire harness and said plurality of wires;
a disconnect connector; and
an electrical connector coupled between said wire harness connector and said disconnect connector, said electrical connector comprising:
a first pass-through connector coupled to said wire harness connector;
a second pass-through connector coupled to said disconnect connector;
a center portion coupled between said first pass-through connector and said second pass-through connector and comprising a plurality of electrical connection points on an exterior surface of said center portion;
an adapter ring configured to couple about said center portion; and
a plurality of pass-through wires extending from first pass-through connector to said second pass-through connector through said center portion, wherein said plurality of electrical connection points are electronically coupled to said plurality of pass-through wires.

13. The avionics system interface of claim 12, wherein said first pass-through connector comprises a sleeve and a first removable insert of a plurality of removable inserts positioned within said sleeve, wherein said plurality of removable inserts are interchangeable based on a configuration of said wire harness connector.

14. The avionics system interface of claim 12, further comprising a shielding material coupled within at least one of said first pass-through connector, said second pass-through connector, and said center portion, wherein said shielding material is configured to reduce electromagnetic interference around said plurality of pass-through wires.

15. The avionics system interface of claim 12, wherein said first pass-through connector comprises one of a plurality of sockets or a plurality of pins, and wherein said second pass-through connector comprises the remaining one of said plurality of sockets or said plurality of pins.

16. The avionics system interface of claim 12, further comprising a plurality of signal connectors coupled between said plurality of electrical connection points and said plurality of pass-through wires, wherein each signal connector of said plurality of signal connectors is configured to electrically couple an electrical connection point of said plurality of electrical connection points to a pass-through wire of said plurality of pass-through wires to carry a signal therebetween.

17. The avionics system interface of claim 16, wherein said plurality of electrical connection points comprise a socket extending into said center portion and configured to receive a pin therein.

18. The avionics system interface of claim 12, wherein said plurality of electrical connection points comprise a first set of electrical contacts, and wherein said adapter ring comprises a second set of electrical contacts on an inner surface of said adapter ring, and wherein said first set of electrical contacts is configured to mate with said second set of electrical contacts when said adapter ring is coupled about said center portion.

19. The avionics system interface of claim 18, wherein said adapter ring comprises a plurality of adapter electrical connectors on an outer surface of said adapter ring, wherein said plurality of adapter electrical connectors are electrically coupled to said plurality of pass-through wires via said first set of electrical contacts and said second set of electrical contacts.

20. The avionics system interface of claim 18, wherein said adapter ring comprises a hinge.

21. The avionics system interface of claim 18, wherein said first set of electrical contacts comprises one of a plurality of protrusions or a plurality of recesses, and wherein said second set of electrical contacts comprises the remaining one of said plurality of protrusions or said plurality of recesses.

22. An electrical connector for use with a wire harness connector the electrical connector comprising:
a first pass-through connector, wherein said first pass-through connector comprises a sleeve and a first removable insert of a plurality of removable inserts positioned within said sleeve, wherein said plurality of removable inserts are interchangeable based on a configuration of the wire harness connector;
a second pass-through connector;
a center portion coupled between said first pass-through connector and said second pass-through connector and comprising a plurality of electrical connection points on an exterior surface of said center portion; and
a plurality of pass-through wires extending from first pass-through connector to said second pass-through connector through said center portion, wherein said plurality of electrical connection points are electronically coupled to said plurality of pass-through wires.

23. The electrical connector of claim 22, further comprising a plurality of signal connectors coupled between said plurality of electrical connection points and said plurality of pass-through wires, wherein each signal connector of said plurality of signal connectors is configured to electrically couple an electrical connection point of said plurality of electrical connection points to a pass-through wire of said plurality of pass-through wires to carry a signal therebetween.

24. The electrical connector of claim 22, wherein each electrical connection point of said plurality of electrical connection points is electrically coupled to a corresponding pass-through wire of said plurality of pass-through wires.

25. The electrical connector of claim 22, wherein said plurality of electrical connection points comprise a socket extending into said center portion and configured to receive a pin therein.

26. The electrical connector of claim 22, wherein said plurality of electrical connection points comprise a pin and a wire extending from said center portion and configured to be inserted into a socket.

27. The electrical connector of claim 22, further comprising an adapter ring configured to couple about said center portion.

28. The electrical connector of claim 27, wherein said plurality of electrical connection points comprise a first set of electrical contacts, and wherein said adapter ring comprises a second set of electrical contacts on an inner surface R of said adapter ring, and wherein said first set of electrical contacts is configured to mate with said second set of electrical contacts when said adapter ring is coupled about said center portion.

29. The electrical connector of claim 28, wherein said first set of electrical contacts comprises one of a plurality of protrusions or a plurality of recesses, and wherein said second set of electrical contacts comprises the remaining one of said plurality of protrusions or said plurality of recesses.

30. The electrical connector of claim 28, wherein said adapter ring comprises a plurality of adapter electrical connectors on an outer surface of said adapter ring, wherein said plurality of adapter electrical connectors are electrically coupled to said plurality of pass-through wires via said first set of electrical contacts and said second set of electrical contacts.

31. The electrical connector of claim 28, wherein said adapter ring comprises a fastening mechanism configured to form a break in said adapter ring to facilitate coupling said adapter ring about said center portion.

32. An avionics system interface comprising:
a wire harness comprising a plurality of wires;
a wire harness connector coupled to said wire harness and said plurality of wires;
a disconnect connector; and
an electrical connector coupled between said wire harness connector and said disconnect connector, said electrical connector comprising:
 a first pass-through connector coupled to said wire harness connector, wherein said first pass-through connector comprises a sleeve and a first removable insert of a plurality of removable inserts positioned within said sleeve, wherein said plurality of removable inserts are interchangeable based on a configuration of said wire harness connector;
 a second pass-through connector coupled to said disconnect connector;
 a center portion coupled between said first pass-through connector and said second pass-through connector and comprising a plurality of electrical connection points on an exterior surface of said center portion; and
 a plurality of pass-through wires extending from first pass-through connector to said second pass-through connector through said center portion, wherein said plurality of electrical connection points are electronically coupled to said plurality of pass-through wires.

33. The avionics system interface of claim 32, further comprising a shielding material coupled within at least one of said first pass-through connector, said second pass-through connector, and said center portion, wherein said shielding material is configured to reduce electromagnetic interference around said plurality of pass-through wires.

34. The avionics system interface of claim 32, wherein said first pass-through connector comprises one of a plurality of sockets or a plurality of pins, and wherein said second pass-through connector comprises the remaining one of said plurality of sockets or said plurality of pins.

35. The avionics system interface of claim 32, further comprising a plurality of signal connectors coupled between said plurality of electrical connection points and said plurality of pass-through wires, wherein each signal connector of said plurality of signal connectors is configured to electrically couple an electrical connection point of said plurality of electrical connection points to a pass-through wire of said plurality of pass-through wires to carry a signal therebetween.

36. The avionics system interface of claim 35, wherein said plurality of electrical connection points comprise one of a socket extending into said center portion and configured to receive a pin therein, or a pin and a wire extending from said center portion and configured to be inserted into a socket.

37. The avionics system interface of claim 32, further comprising an adapter ring configured to couple about said center portion, wherein said plurality of electrical connection points comprise a first set of electrical contacts, and wherein said adapter ring comprises a second set of electrical contacts on an inner surface of said adapter ring, and wherein said first set of electrical contacts is configured to mate with said second set of electrical contacts when said adapter ring is coupled about said center portion.

38. The avionics system interface of claim 37, wherein said adapter ring comprises a plurality of adapter electrical connectors on an outer surface of said adapter ring, wherein said plurality of adapter electrical connectors are electrically coupled to said plurality of pass-through wires via said first set of electrical contacts and said second set of electrical contacts.

39. The avionics system interface of claim 37, wherein said adapter ring comprises a hinge.

40. The avionics system interface of claim 37, wherein said first set of electrical contacts comprises one of a plurality of protrusions or a plurality of recesses, and wherein said second set of electrical contacts comprises the remaining one of said plurality of protrusions or said plurality of recesses.

* * * * *

UNITED STATES PATENT AND TRADEMARK OFFICE
CERTIFICATE OF CORRECTION

| | |
|---|---|
| PATENT NO. | : 10,553,993 B2 |
| APPLICATION NO. | : 15/950594 |
| DATED | : February 4, 2020 |
| INVENTOR(S) | : Allen |

Page 1 of 1

It is certified that error appears in the above-identified patent and that said Letters Patent is hereby corrected as shown below:

In the Claims

In Column 11, Line 20, in Claim 28, delete "R".

Signed and Sealed this
Thirty-first Day of March, 2020

Andrei Iancu
*Director of the United States Patent and Trademark Office*